United States Patent
Teraguchi

(10) Patent No.: US 8,476,956 B2
(45) Date of Patent: Jul. 2, 2013

(54) SEMICONDUCTOR SWITCH

(75) Inventor: Takayuki Teraguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/234,010

(22) Filed: Sep. 15, 2011

(65) Prior Publication Data

US 2012/0126875 A1     May 24, 2012

(30) Foreign Application Priority Data

Nov. 24, 2010    (JP) ................................. 2010-260804

(51) Int. Cl.
    *H03L 5/00*          (2006.01)

(52) U.S. Cl.
    USPC .......................................... 327/333; 327/108

(58) Field of Classification Search
    USPC ................... 327/108, 112, 333, 427; 326/68, 326/80–83; 365/189.11
    See application file for complete search history.

(56) References Cited

U.S. PATENT DOCUMENTS

2011/0050323 A1 *    3/2011   Seshita ......................... 327/427

FOREIGN PATENT DOCUMENTS

| JP | 11-145820 | 5/1999 |
| JP | 2010-103971 | 5/2010 |

* cited by examiner

*Primary Examiner* — Long Nguyen
(74) *Attorney, Agent, or Firm* — Turocy & Watson, LLP

(57) ABSTRACT

According to one embodiment, a semiconductor switch includes a power supply section, a driver, and a switch section. The power supply section is configured to generate a first potential higher than a positive power supply potential, and a negative second potential. The driver is connected to the power supply section and configured to output a control signal. A potential of the control signal is set to the first potential at high level and set to the second potential at low level according to a terminal switching signal. The switch section is configured to receive the control signal and switch a connection between terminals. The driver has a first level shifter, a second level shifter and a first circuit. The first level shifter has a first high-side switch and a first low-side switch. The second level shifter has a second high-side switch and a second low-side switch.

20 Claims, 8 Drawing Sheets

SEMICONDUCTOR SWITCH

CROSS-REFERENCE TO RELATED APPLICATIONS

This application is based upon and claims the benefit of priority from the prior Japanese Patent Application No. 2010-260804, filed on Nov. 24, 2010; the entire contents of which are incorporated herein by reference.

FIELD

Embodiments described herein relate generally to a semiconductor switch.

BACKGROUND

Semiconductor switches to open and close a circuit can be used in various electronic devices. For example, in a radio frequency circuit of a mobile phone, a transmitting circuit and a receiving circuit are selectively connected to a common antenna through a radio frequency switch circuit. For a switch element of a switch circuit for radio frequency signals like this, a MOSFET (Metal Oxide Semiconductor Field Effect Transistor) is used. For example, in order to implement radio frequency characteristics as demanded in mobile phones, it is necessary to supply an appropriate gate potential to each FET. Thus, the response characteristics of a driver to supply the gate potential to each FET affects characteristics or affect switch time in switching terminals.

DETAILED DESCRIPTION

Figure 1:
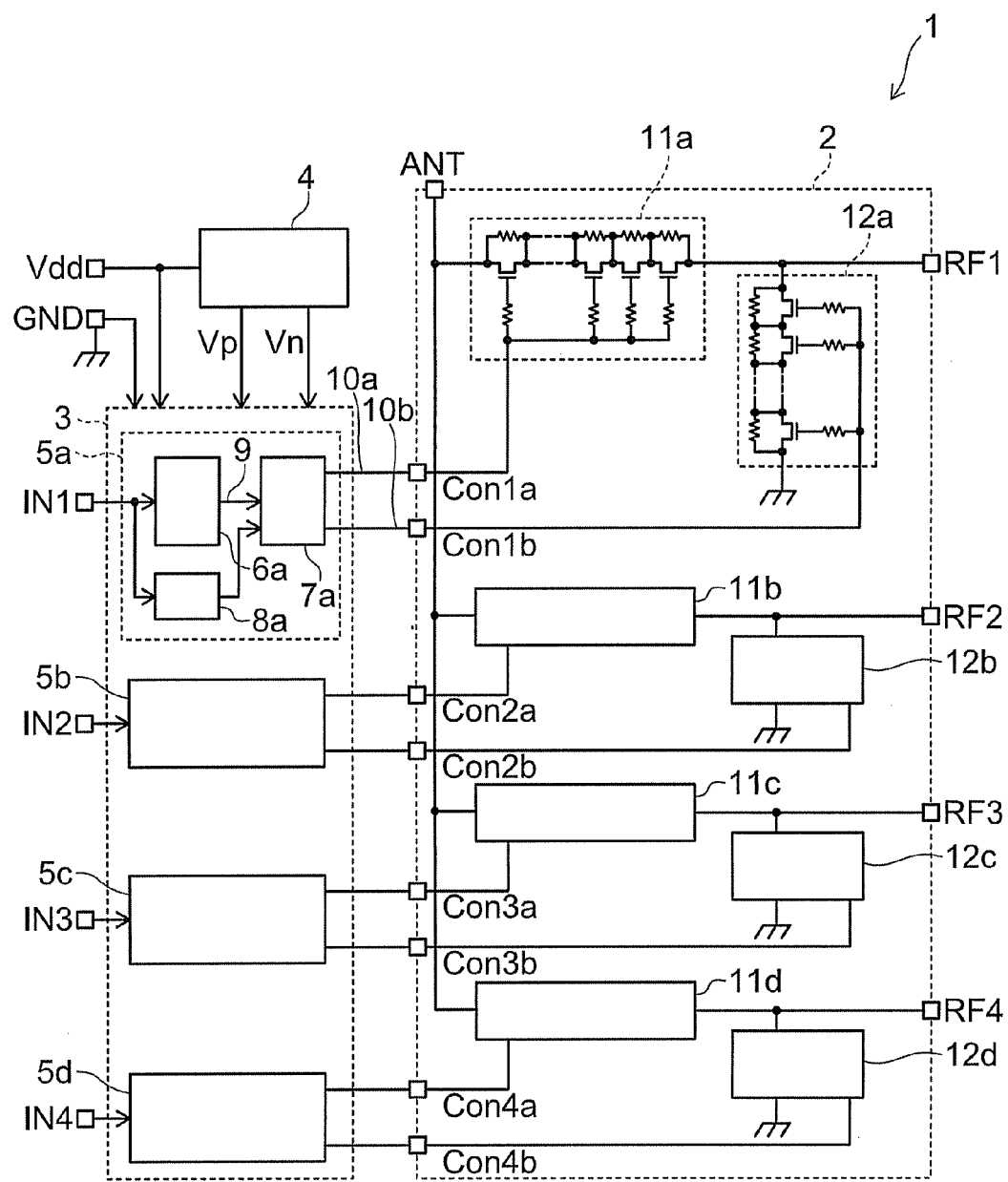
FIG. 1 is a block diagram illustrating a configuration of a semiconductor switch according to a first embodiment.

In general, according to one embodiment, a semiconductor switch includes a power supply section, a driver and a switch section. The power supply section is configured to generate a first potential higher than a positive power supply potential, and a negative second potential. The driver is connected to the power supply section and configured to output a control signal. A potential of the control signal is set to the first potential at high level and set to the second potential at low level according to a terminal switching signal. The switch section is configured to receive the control signal and switch a connection between terminals. The driver has a first level shifter, a second level shifter and a first circuit. The first level shifter has a first high-side switch and a first low-side switch. The first high-side switch and the first low-side switch are connected in series between a first high potential power supply line supplied with the first potential or the power supply potential and a first low potential power supply line supplied with a ground potential or the second potential. The first high-side switch and the first low-side switch are exclusively turned on to each other according to the terminal switching signal. The second level shifter has a second high-side switch and a second low-side switch. The second high-side switch and the second low-side switch are connected in series between a second high potential power supply line supplied with the first potential and a second low potential power supply line supplied with the second potential. The second high-side switch and the second low-side switch are exclusively turned on to each other according to an output potential of the first level shifter. The first circuit is configured to supply the power supply potential to the second low-side switch or supply the ground potential to the high-side switch according to the terminal switching signal, before the potential of the control signal being changed, and turn on the second low-side switch.

Embodiments will now be described with reference to the drawings. In the specification and drawings, components similar to those described or illustrated in a drawing thereinabove are marked with like reference numerals, and a detailed description is omitted as appropriate.

First Embodiment

FIG. 1 is a block diagram illustrating a configuration of a semiconductor switch according to a first embodiment.

As illustrated in FIG. 1, a semiconductor switch 1 is provided with a switch section 2 that switches connections between a common terminal ANT and radio frequency terminals RF1 to RF4. The switch section 2 switches the connections between the terminals according to control signals Con1a to Con4b outputted from a driver 3.

The driver 3 level-shifts terminal switching signals inputted to switching signal terminals IN1 to IN4, and outputs the signals as the control signals Con1a to Con4b. The driver 3 is supplied with a first potential Vp higher than a positive power supply potential Vdd and a negative second potential Vn.

Here, the first potential Vp is a high-level potential of the control signals Con1a to Con4b, and is a potential applied to the gate of each FET in the switch section 2 for turning on each FET. The second potential Vn is a low level potential of the control signals Con1a to Con4b, and is a potential applied to the gate of each FET in the switch section 2 for turning off each FET.

The first potential Vp and the second potential Vn are supplied from a power supply section 4. The power supply section 4 is supplied with the positive power supply potential Vdd, and generates the first potential Vp higher than the power supply potential Vdd and the negative second potential Vn. The power supply section 4 is formed of an oscillator, a charge pump, and the like, for example.

The semiconductor switch 1 is a SP4T (Single-Pole 4-Throw) switch that switches the connections between the common terminal ANT and the radio frequency terminals RF1 to RF4.

In FIG. 1, the SP4T switch is illustrated as the configuration of the switch section 2. However, the switch section 2 can be similarly applied to switches in the other configurations, and the switch section 2 can also configure a kPwT switch (where k and w are natural numbers).

In FIG. 1, although the configuration is illustrated in which four-bit terminal switching signals are inputted to the switching signal terminals IN1 to IN4, it may be possible to provide a decoder for the driver 3. For example, such a configuration may be possible that terminal switching signals encoded into two bit signals are inputted, the signals are decoded into four bit signals with the decoder, and then the control signals Con1a to Con4b are outputted.

Next, each of the sections and components will be described.

In the switch section 2, first switch elements 11a to 11d are connected between the common terminal ANT and each of the radio frequency terminals RF1 to RF4. The first switch elements 11a to 11d are individually turned on, so that a transmission line is formed between the common terminal ANT and each of the radio frequency terminals RF1 to RF4.

In the first switch element 11a, n stages of through FETs (n is a natural number) are connected in series to each other. The control signal Con1a is inputted to the gate of each of the through FETs through a resister for preventing radio frequency leakage. A resister is connected between the drain and source of each of the through FETs to equalize a voltage applied to each through FET. The first switch elements 11b, 11c, and 11d each have the same configuration as the configuration of the first switch element 11a. The first switch elements 11b, 11c, and 11d receive the control signals Con2a, Con3a, and Con4a, respectively.

Second switch elements 12a to 12d are connected between the radio frequency terminals RF1 to RF4 and a ground GND, respectively. The second switch elements 12a to 12d let a leakage current carried through the radio frequency terminals RF1 to RF4 go to the ground when the first switch elements 11a to 11d are off for improving isolation between the radio frequency terminals RF1 to RF4.

In the second switch element 12a, m stages of shunt FETs (m is a natural number) are connected in series to each other. The control signal Con1b is inputted to the gate of each of the shunt FETs through a resister for preventing radio frequency leakage. A resister is connected between the drain and source of each of the shunt FETs to equalize a voltage applied to each shunt FET. The second switch elements 12b, 12c, and 12d each have the same configuration as the configuration of the second switch element 12a. The second switch elements 12b, 12c, and 12d receive the control signals Con2b, Con3b, and Con4b, respectively.

For example, in order to conduct electricity between the radio frequency terminal RF1 and the common terminal ANT, the first switch element 11a between the radio frequency terminal RF1 and the common terminal ANT is turned on, and the second switch element 12a between the radio frequency terminal RF1 and the ground is turned off. Namely, the through FETs in the first switch element 11a are all turned on, and the shunt FETs in the second switch element 12a are all turned off.

At the same time, the first switch elements 11b, 11c, and 11d between the other radio frequency terminals RF2, RF3, and RF4 and the common terminal ANT are all turned off, and the second switch elements 12b, 12c, and 12d between the other radio frequency terminals RF2, RF3, and RF4 and the ground GND are all turned on. Namely, the through FETs in the first switch elements 11b, 11c, and 11d are all turned off, and the shunt FETs in the second switch elements 12b, 12c, and 12d are all turned on.

In the aforementioned case, the control signal Con1a is set at an ON-potential Von, the control signals Con2b, Con3b, and Con4b at the ON-potential Von, the control signal Con1b at an Off-potential Voff, and the control signal Con 2a, Con3a, Con4a at the Off-potential Voff.

Here, the ON-potential Von is a potential that each FET is turned to a conducting state and the ON resistance of each FET takes a sufficiently small value; the potential is set at a potential of 3.5 V, for example. The Off-potential Voff is a potential that each FET is turned to a blocking state and the blocking state can be sufficiently maintained even though an RF signal is superposed; the potential is set at a potential of −1.5 V, for example.

The power supply section 4 outputs the first potential Vp that the aforementioned ON-potential Von takes a stationary value and the second potential Vn that the Off-potential Voff takes a stationary value. As described in FIG. 5, when the connections between the terminals in the switch section 2 are switched according to the terminal switching signals, the first potential Vp and the second potential Vn vary.

The driver 3 has level shifters 5a to 5d that respectively drive the first switch elements 11a to 11d and the second switch elements 12a to 12d connected to the radio frequency terminals RF1 to RF4. Since the switch section 2 has four radio frequency terminals RF1 to RF4, the driver 3 is provided with four level shifters 5a to 5d in the same configuration.

In the level shifter 5a, a first level shifter 6a level-shifts a one-bit terminal switching signal inputted to the switching signal terminal IN1, and outputs the signal to a first output line 9. A second level shifter 7a is connected to the first output line 9, and level-shifts the output potential of the first level shifter 6a, and outputs the output potential as the control signals Con1a and Con1b to the second output lines 10a and 10b, respectively. The potentials of the second output lines 10a and 10b, that is, the potentials of the control signals Con1a and Co1b are level-shifted in such a way that the high level potential is level-shifted to the first potential Vp and the low level potential is level-shifted to the second potential Vn according to the output potential of the first level shifter 6a.

A first circuit 8a supplies the power supply potential Vdd or a ground potential to the second level shifter 7a according to the one-bit terminal switching signal inputted to the switching signal terminal IN1, before the potentials of the control signals Con1a and Con1b are changed.

Figure 4A:
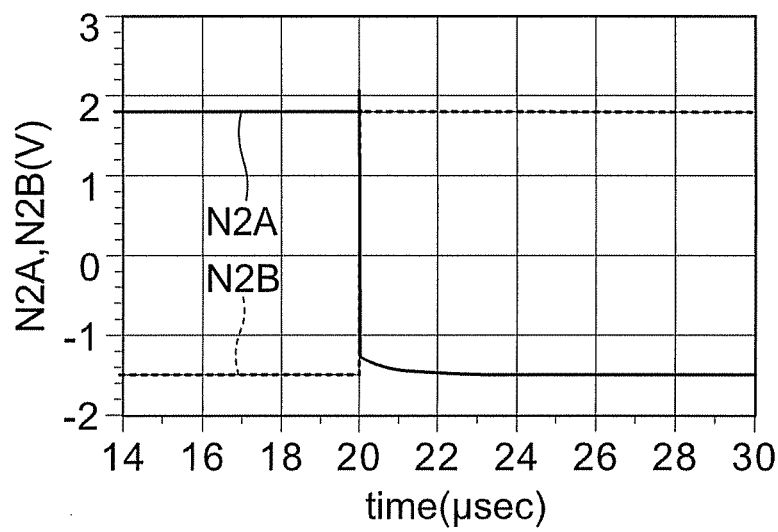
FIG. 4A and FIG. 4B are waveform diagrams of main signals of the level shifter shown in FIG. 2.
Figure 4B:
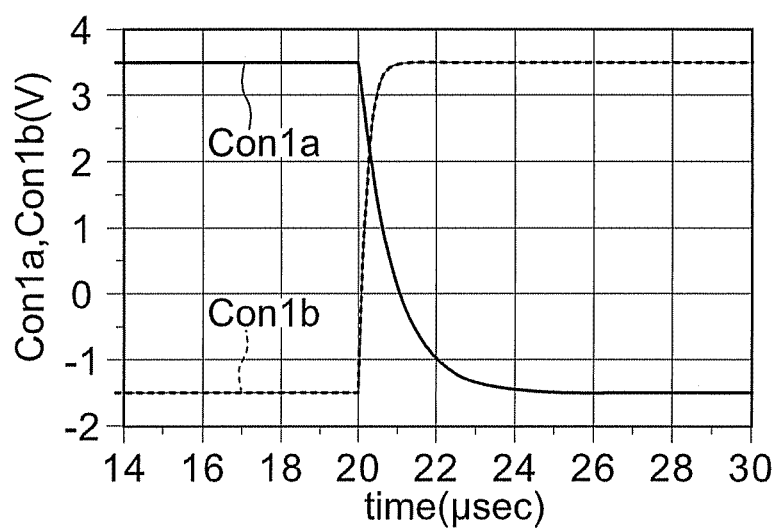

As described in FIG. 4A and FIG. 4B, in the level shifter 5a, propagation delay time is shortened by this first circuit 8a, and the response characteristics of the switch section 2 in switching the terminals are improved.

As described above, the level shifters 5b, 5c, and 5d each have the same configuration as the configuration of the level shifter 5a.

The level shifter 5a receives the one-bit terminal switching signal from the switching signal terminal IN1, and outputs the control signals Con1a and Con1b in which the high level potential is level-shifted to the first potential Vp and the low level potential is level-shifted to the second potential Vn. The level shifter 5b receives a one-bit terminal switching signal from the switching signal terminal IN2, and outputs the control signals Conga and Con2b. The level shifter 5c receives a one-bit terminal switching signal from the switching signal terminal IN3, and outputs the control signals Con3a and Con3b. The level shifter 5d receives a one-bit terminal switching signal from the switching signal terminal IN4, and outputs the control signals Con4a and Con4b.

As described above, the driver 3 outputs the control signals Con1a to Con4b that make the first potential Vp at high level and the second potential Vn at low level according to the terminal switching signals.

Since the level shifters 5a to 5d in the driver 3 have the same configuration, one level shifter 5a will be described in detail.

Figure 2:
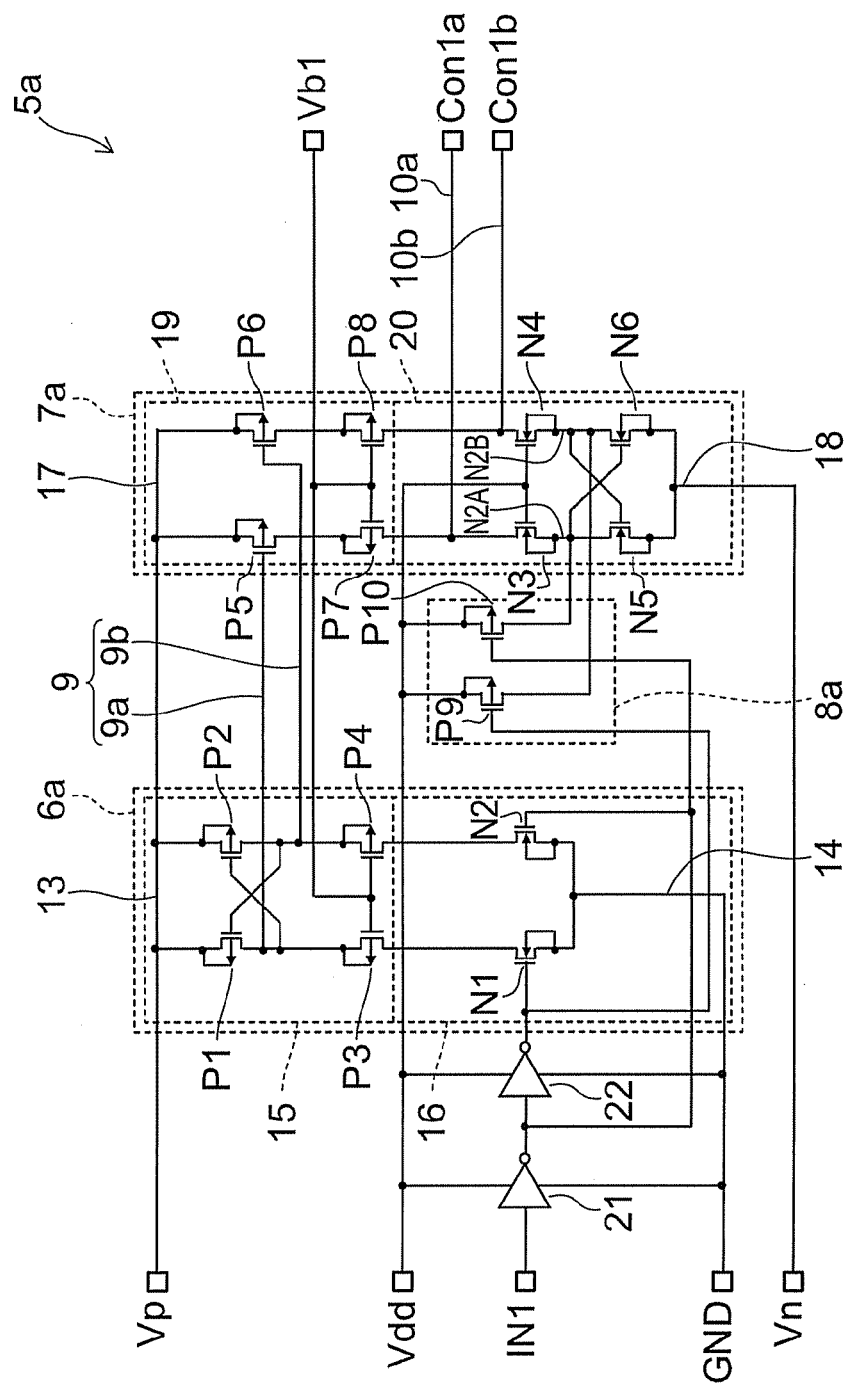
FIG. 2 is a circuit diagram illustrating a configuration of a level shifter in the driver shown in FIG. 1.

FIG. 2 is a circuit diagram illustrating a configuration of a level shifter in the driver shown in FIG. 1. In addition, components common to those in FIG. 1 are marked with like reference numerals.

In the first level shifter 6a, a first high-side switch 15 and a first low-side switch 16 are connected in series between a first high potential power supply line 13 and a first low potential power supply line 14. The first potential Vp is supplied to the first high potential power supply line 13. The first low potential power supply line 14 is connected to the ground GND, and the ground potential is supplied to the first low potential power supply line 14.

The first low-side switch 16 is provided with a pair of first input transistors N1 and N2. The first input transistors N1 and N2 are formed of an N-channel MOSFET (hereinafter NMOS). The sources of the first input transistors N1 and N2 are connected to the first low potential power supply line 14.

The gate of the first input transistor N2 receives the one-bit terminal switching signal from the switching signal terminal IN1 through an inverter (INV) 21. The gate of the first input transistor N1 receives the one-bit terminal switching signal from the switching signal terminal IN1 through the INV 21 and an INV 22. The first input transistors N1 and N2 receive signals inverted to each other.

In addition, the power supply potential Vdd is supplied to the power supply terminals of the INV 21 and the INV 22, and the ground terminals of the INV 21 and the INV 22 are connected to the ground GND.

The first low-side switch 16 is formed of a differential circuit of the pair of the first input transistors N1 and N2.

The first high-side switch 15 is provided with a pair of first output transistors P1 and P2. The first output transistors P1 and P2 are formed of a P-channel MOSFET (hereinafter PMOS).

The first output transistor P1 is connected between the first high potential power supply line 13 and a first output line 9a. The first output transistor P2 is connected between the first high potential power supply line 13 and a first output line 9b. The first output transistors P1 and P2 are cross-coupled to each other. It is noted that the output line 9 shown in FIG. 1 is formed of a pair of the first output lines 9a and 9b in FIG. 2.

For more detailed explanation, the sources of the first output transistors P1 and P2 are connected to the first high potential power supply line 13. The gate of the first output transistor P1 is connected to the drain of the first output transistor P2, and the gate of the first output transistor P2 is connected to the drain of the first output transistor P1. The drain of the first output transistor P1 is connected to the first output line 9a. The drain of the first output transistor P2 is connected to the first output line 9b.

In the first high-side switch 15, a pair of first series transistors P3 and P4 are connected between the first output lines 9a and 9b and the first low-side switch 16. The first series transistors P3 and P4 are formed of a PMOS. A first bias potential Vb1 is supplied to the gates of the first series transistors P3 and P4.

For more detailed explanation, the first series transistor P3 is connected between the first output line 9a and the first input transistor N1 of the first low-side switch 16. The first series transistor P4 is connected between the first output line 9b and the first input transistor N2 of the first low-side switch 16.

The first high-side switch 15 is formed of a differential circuit of the pair of the first output transistors P1 and P2 and the pair of the first series transistors P3 and P4. Differential signals are outputted to the first output lines 9a and 9b.

In the second level shifter 7a, a second high-side switch 19 and a second low-side switch 20 are connected in series between a second high potential power supply line 17 and a second low potential power supply line 18. The first potential Vp is supplied to the second high potential power supply line 17. The second potential Vn is supplied to the second low potential power supply line 18.

The second high-side switch 19 is provided with a pair of second input transistors P5 and P6. The second input transistors P5 and P6 are formed of a PMOS. The sources of the second input transistors P5 and P6 are connected to the second high potential power supply line 17.

The gates of the second input transistors P5 and P6 are connected to the first output lines 9a and 9b, respectively. The second input transistors P5 and P6 receive signals inverted to each other from the first level shifter 6a.

A pair of second series transistors P7 and P8 are connected between the pair of the second input transistors P5 and P6 and the second output lines 10a and 10b. The second series transistors P7 and P8 are formed of a PMOS. The first bias potential Vb1 is supplied to the gates of the second series transistors P7 and P8.

For more detailed explanation, the source of the second series transistor P7 is connected to the drain of the second input transistor P5, and the drain of the second series transistor P7 is connected to the second output line 10a. The source of the second series transistor P8 is connected to the drain of the second input transistor P6, and the drain of the second series transistor P8 is connected to the second output line 10b.

The second high-side switch 19 is formed of a differential circuit of the pair of the second input transistors P5 and P6 and the pair of the second series transistors P7 and P8.

The second low-side switch 20 is provided with a pair of third series transistors N3 and N4, and a pair of second output transistors N5 and N6. The third series transistors N3 and N4 and the second output transistors N5 and N6 are formed of an NMOS.

The pair of the third series transistors N3 and N4 and the pair of the second output transistors N5 and N6 are connected in series between the second output lines 10a and 10b and the second low potential power supply line 18. The second output transistors N5 and N6 are cross-coupled to each other.

For more detailed explanation, the sources of the second output transistors N5 and N6 are connected to the second low potential power supply line 18. The gate of the second output transistor N5 is connected to the drain of the second output transistor N6, and the gate of the second output transistor N6 is connected to the drain of the second output transistor N5.

The third series transistor N3 is connected between the second output line 10a and the second output transistor N5. The third series transistor N4 is connected between the second output line 10b and the second output transistor N6. The power supply potential Vdd is supplied as a second bias potential to the gates of the third series transistors N3 and N4.

The second low-side switch 20 is formed of a differential circuit of the pair of the third series transistors N3 and N4 and the pair of the second output transistors N5 and N6.

The first circuit 8a is provided with a pair of first transistors P9 and P10. The first transistors P9 and P10 are formed of a PMOS. The first transistors P9 and P10 are connected to the second low-side switch 20, and supply the power supply potential Vdd to the second low-side switch 20 according to the one-bit terminal switching signal inputted to the switching signal terminal IN1. The first transistors P9 and P10 then turn on the second output transistors N5 and N6 of the second low-side switch 20.

For more detailed explanation, the power supply potential Vdd is supplied to the sources of the first transistors P9 and P10. The drain of the first transistor P9 is connected to the drain of the second output transistor N6 of the second low-side switch 20. The gate of the first transistor P9 receives the one-bit terminal switching signal inputted to the switching signal terminal IN1 through the INV 21 and the INV22. The drain of the first transistor P10 is connected to the drain of the second output transistor N5 of the second low-side switch 20. The gate of the first transistor P10 receives the one-bit terminal switching signal inputted to the switching signal terminal IN1 through the INV 21.

The first circuit 8a supplies the power supply potential Vdd to the second low-side switch 20 according to the one-bit terminal switching signal inputted to the switching signal terminal IN1, and turns on the second low-side switch 20. Thus, the potentials of the control signals Con1a and Con1b turn from the high level potential to the low level potential, before the potentials of the control signals Con1a and Con1b are changed according to changes in the potentials of the first output lines 9a and 9b.

Next, the operation of the level shifter 5a will be described in detail.

In the first level shifter 6a, when consideration is given to the first output line 9a side (the first output transistor P1, the first series transistor P3, and the first input transistor N1), the first high-side switch 15 and the first low-side switch 16 are exclusively turned on to each other according to the terminal switching signal.

When consideration is given to the first output line 9b side (the first output transistor P2, the first series transistor P4, and the first input transistor N2), the first high-side switch 15 and the first low-side switch 16 are exclusively turned on to each other according to the terminal switching signal. The first output lines 9a and 9b are electrically connected to the first high potential power supply line 13 or the first low potential power supply line 14 according to the terminal switching signal.

Here, based on the first output line 9a side, a state in which the first output transistor P1 and the first series transistor P3 of the first high-side switch 15 are in the ON state is a state in which the first high-side switch 15 is in the ON state. A state in which the first input transistor N1 of the first low-side switch 16 is in the ON state is a state in which the first low-side switch 16 is in the ON state. The same things applied to the other embodiments described below.

For example, the threshold voltage of the NMOS is about a voltage of 0.6 V, and the threshold voltage of the PMOS is about a voltage −0.6 V. Suppose that a low level potential (0 V) is inputted to the switching signal terminal IN1, where the power supply potential Vdd=1.8 V, the first potential Vp=3.5 V, and the second potential Vn=−1.5 V.

The first input transistor N1 is turned off, and the first input transistor N2 is turned on. Thus, the first low-side switch 16 is turned off.

The first input transistor N2 is turned on, so that the potential of the first high-side switch 15 on the first output line 9b side is lowered. The first input transistor N1 is turned off, so that the potential of the first high-side switch 15 on the first output line 9a side is made at a high potential with respect to the potential on the first output line 9b side.

Thus, the first output line 9a side of the first high-side switch 15 is turned on, and the first output line 9b side is turned off. Therefore, the first high-side switch 15 is turned on. The potential of the first output line 9a, that is, the output potential of the first level shifter 6a is made at the first potential Vp at high level.

The potential of the first output line 9b is made at a potential that a potential difference between the first potential Vp and the ground GND is divided by the first output transistor P2 and the first series transistor P4 on the first output line 9b side.

Since the first bias potential Vb1 is supplied to the gate of the first series transistor P4, the potential of the first output line 9b is kept approximately at the first bias potential Vb1. Although depending on the size ratio or the like of the transistors, the potential of the first output line 9b becomes at a potential of 1.2 V, when the first bias potential Vb1 is at a potential of 1.0 V, for example.

As described above, the first high-side switch 15 is turned on or off according to the ON state or Off state of the first low-side switch 16.

The first series transistors P3 and P4 are connected in series to the first output transistors P1 and P2 in order to lower the gate-source voltage and drain-source voltage of each PMOS when PMOSs are off. For example, in the case of the aforementioned exemplary numeric values, the gate-source voltages and drain-source voltages of the first output transistor P2 and the first series transistor P4 do not exceed a voltage of 2.8 V when PMOSs are off.

In the second level shifter 7a, when consideration is given to the second output line 10a side (the second input transistor P5, the second series transistor P7, the second output transistor N5, and the third series transistor N3), the second high-side switch 19 and the second low-side switch 20 are exclusively turned on to each other according to the terminal switching signal.

When consideration is given to the second output line 10b side (the second input transistor P6, the second series transistor P8, the second output transistor N6, and the third series transistor N4), the second high-side switch 19 and the second low-side switch 20 are exclusively turned on to each other according to the terminal switching signal. The second output lines 10a and 10b are electrically connected to the second high potential power supply line 17 or the second low potential power supply line 18 according to the output potential of the first level shifter 6a.

Here, based on the second output line 10a side, a state in which the second input transistor P5 and the second series transistor P7 of the second high-side switch 19 are in the ON state is a state in which the second high-side switch 19 is in the ON state. A state in which the second output transistor N5 and the third series transistor N3 of the second low-side switch 20 are in the ON state is a state in which the second low-side switch 20 is in the ON state. The same things applied to the other embodiments described below.

For example, suppose that a low level potential (0 V) is inputted to the switching signal terminal IN1 as described above, the potential of the first output line 9a is made at a potential of 3.5 V at high level, and the potential of the first output line 9b is made at a potential of 1.2 V at low level. The second input transistor P5 and the second series transistor P7 are turned off. The second input transistor P6 and the second series transistor P8 are turned on. Thus, the second high-side switch 19 is turned off.

The second input transistor P6 and the second series transistor P8 are turned on, so that the potential of the second low-side switch 20 on the second output line 10b side (the potential of the control signal Con1b) is raised. The second input transistor P5 and the second series transistor P7 are turned off, so that the potential of the second low-side switch 20 on the second output line 10a side (the potential of the control signal Con1a) is lowered.

With a lowering in the potential of the second output line 10a, a drain potential N2A of the second output transistor N5 is also lowered. With a raising in the potential of the second output line 10b, a drain potential N2B of the second output transistor N6 is also raised.

On the other hand, the first transistor P9 of the first circuit 8a is turned on to supply the power supply potential Vdd to the drain of the second output transistor N6 of the second low-side switch 20.

The drain potential N2B of the second output transistor N6 is made at the power supply potential Vdd, and the second output transistor N5 is turned on. The drain potential N2A of the second output transistor N5 is made at the ground potential, and the second output transistor N6 is turned off. The third series transistor N3 is turned on, and the third series transistor N4 is turned off. The second low-side switch 20 is turned on.

Thus, the potential of the second output line 10a is made at the second potential Vn at low level, and the potential of the second output line 10b is made at the first potential Vp at high level.

As described above, the second low-side switch 20 is turned on by the first circuit 8a, before turned on or off according to the ON state or Off state of the second high-side switch 19.

In order to lower the gate-source voltage and drain-source voltage of each NMOS when NMOSs are off, the third series transistors N3 and N4 are connected in series to the second output transistors N5 and N6. For example, in the case of the aforementioned exemplary numeric values, the gate-source voltages and drain-source voltages of the second output transistor N6 and the third series transistor N4 do not exceed a voltage of 3.5 V when NMOSs are off.

As described above, the first to third series transistors P3, P4, P7, P8, N3, and N4 are used for lowering the gate-source voltages and drain-source voltages of each PMOS and NMOS when PMOSs and NMOSs are off. A low breakdown voltage PMOS and NMOS, a PMOS having a breakdown voltage of 2.8 V and an NMOS having a breakdown voltage of 3.5 V, for example, are used to output control signals Con1a and Con1b with a potential difference of 5.0 V having a high level potential of 3.5 V and a low level potential of −1.5 V.

However, such a configuration is provided that the second and third series transistors P7, P8, N3, and N4 are connected in series between the second input transistors P5 and P6 and the second output transistors N5 and N6. Thus, the response speeds of the second output transistors N5 and N6 to turn on or off according to turning on or off of the second input transistors P5 and P6 are reduced.

Therefore, in the case where the first circuit 8a is not provided, the propagation delay time of the second level shifter 7a is prolonged. Since the response speed is reduced, a current is carried through the second high-side switch 19 and the second low-side switch 20 at the same time, and a cross current between the second high potential power supply line 17 and the second low potential power supply line 18 is raised.

For example, a level shifter of a comparative example will be considered where the first circuit 8a is not provided.

Figure 3A:
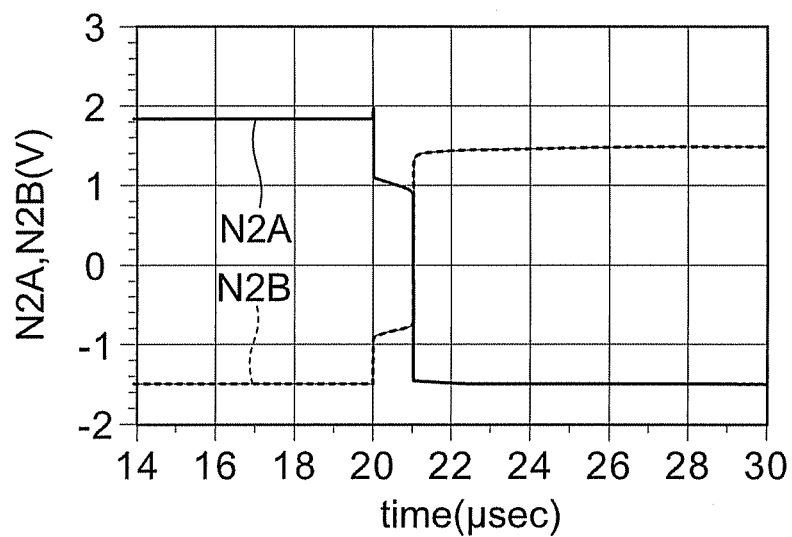
FIG. 3A and FIG. 3B are waveform diagrams of main signals of a level shifter of a comparative example.
Figure 3B:
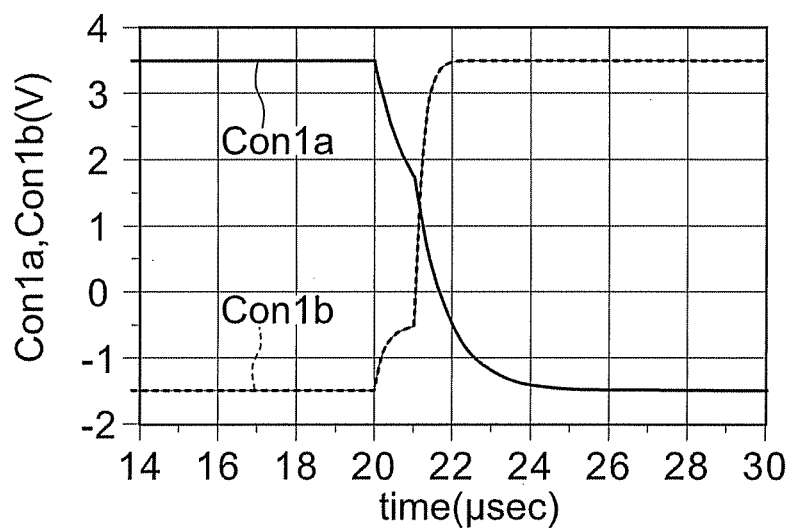

FIG. 3A and FIG. 3B are waveform diagrams of main signals of the level shifter of the comparative example. FIG. 3A shows drain potentials N22A and N22B of a second output transistor, and FIG. 3B shows the potentials of control signals Con1a and Con1b. It is noted that FIG. 3A and FIG. 3B show signal waveforms in the case where the potential of a terminal switching signal inputted to a switching signal terminal IN1 is changed from high level to low level at time=20 μs.

As illustrated in FIG. 3A, the drain potential N22A of a second output transistor N5 is at a potential of about 1.0 V until time=20 μs to 21 μs, and a second output transistor N6 remains on. The drain potential N22B of the second output transistor N6 is at a potential of about −0.8 V, and a third series transistor N4 remains on.

Thus, as illustrated in FIG. 3B, the potential of the control signal Con1b is gently raised until about at time=20 μs to 21 μs. Since the second output transistor N5 and a third series transistor N3 are not turned on yet, the potential of the control signal Con1a is gently lowered.

The second output transistor N5 and the third series transistor N3 are turned on at about time=21 μs, and the drain potential N22A of the second output transistor N5 is made at a potential of −1.5 V at low level. The second output transistor N6 and the third series transistor N4 are turned off, and the drain potential N22B of the second output transistor N6 is changed at high level.

The change in the potential of the control signal Con1a is made gentler as a load capacitance connected to the second output lines 10a and 10b, that is, the gate capacitance of each FET in the switch section 2 is larger.

Therefore, the gate capacitance is more increased and the propagation delay time of a level shifter 5a is more prolonged, as the ON resistance of the switch section 2 is more reduced. The switching time of the switch section 2 is prolonged.

In contrast to the comparative example, in the semiconductor switch 1 according to the first embodiment, the first transistor P9 of the first circuit 8a is turned on to supply the power supply potential Vdd to the drain of the second output transistor N6.

FIG. 4A and FIG. 4B are waveform diagrams of main signals of the level shifter shown in FIG. 2. FIG. 4A shows drain potentials N22A and N22B of the second output transistor, and FIG. 4B shows the potentials of the control signals Con1a and Con1b.

As illustrated in FIG. 4A, the drain potential N2B of the second output transistor N6 is made at the power supply potential Vdd at time=20 μs, and the second output transistor N5 is turned on. The drain potential N2A of the second output transistor N5 is made at the ground potential, the second output transistor N6 is turned off, and the third series transistor N3 is turned on. The third series transistor N4 is turned off.

Thus, as illustrated in FIG. 4B, at time=20 μs, the potential of the control signal Con1a is raised to a potential of 3.5 V at high level, whereas the potential of the control signal Con1b is lowered to a potential of −1.5 V at low level.

As described above, it is possible to use the first circuit 8a to suppress an increase in the propagation delay time caused by the second and third series transistors P7, P8, N3, and N4.

Figure 5A:
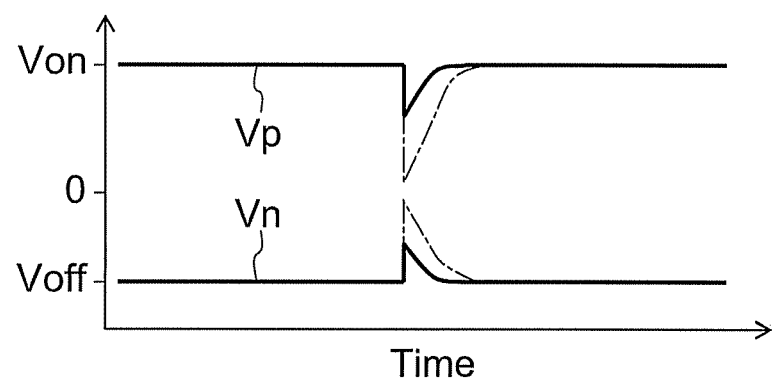
FIG. 5A and FIG. 5B are waveform diagrams of main signals of the semiconductor switch according to the first embodiment.
Figure 5B:
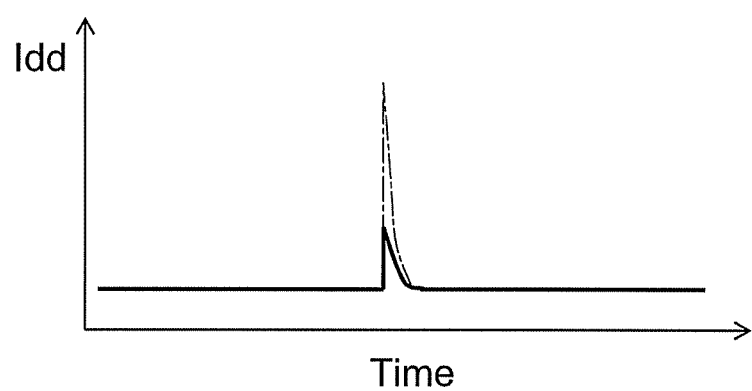

FIG. 5A and FIG. 5B are waveform diagrams of main signals of the semiconductor switch according to the first embodiment. FIG. 5A shows the first potential Vp and the second potential Vn, and FIG. 5B shows a power supply current Idd. In FIG. 5A and FIG. 5B, the signal waveforms of the semiconductor switch 1 are schematically indicated by solid lines, and the signal waveforms in the case of using the level shifter according to the comparative example without the first circuit 8a are schematically indicated by dashed lines.

As illustrated in FIG. 5A, in the semiconductor switch 1, the propagation delay time of the level shifter is shorter than the propagation delay time in the comparative example, so that the variations in the first potential Vp and the second potential Vn are suppressed. In the semiconductor switch 1, the response speed of the second low-side switch 20 is accelerated. Thus, a time period for which a current is carried through the second high-side switch 19 and the second low-side switch 20 at the same time is also shortened. Therefore, the cross current carried between the second high potential power supply line 17 and the second low potential power supply line 18 is reduced more than the cross current in the comparative example. As illustrated in FIG. 5B, an increase in the power supply current Idd in switching the terminals is suppressed.

As described above, in the semiconductor switch 1, it is possible to improve response characteristics in switching the terminals.

Second Embodiment

Figure 6:
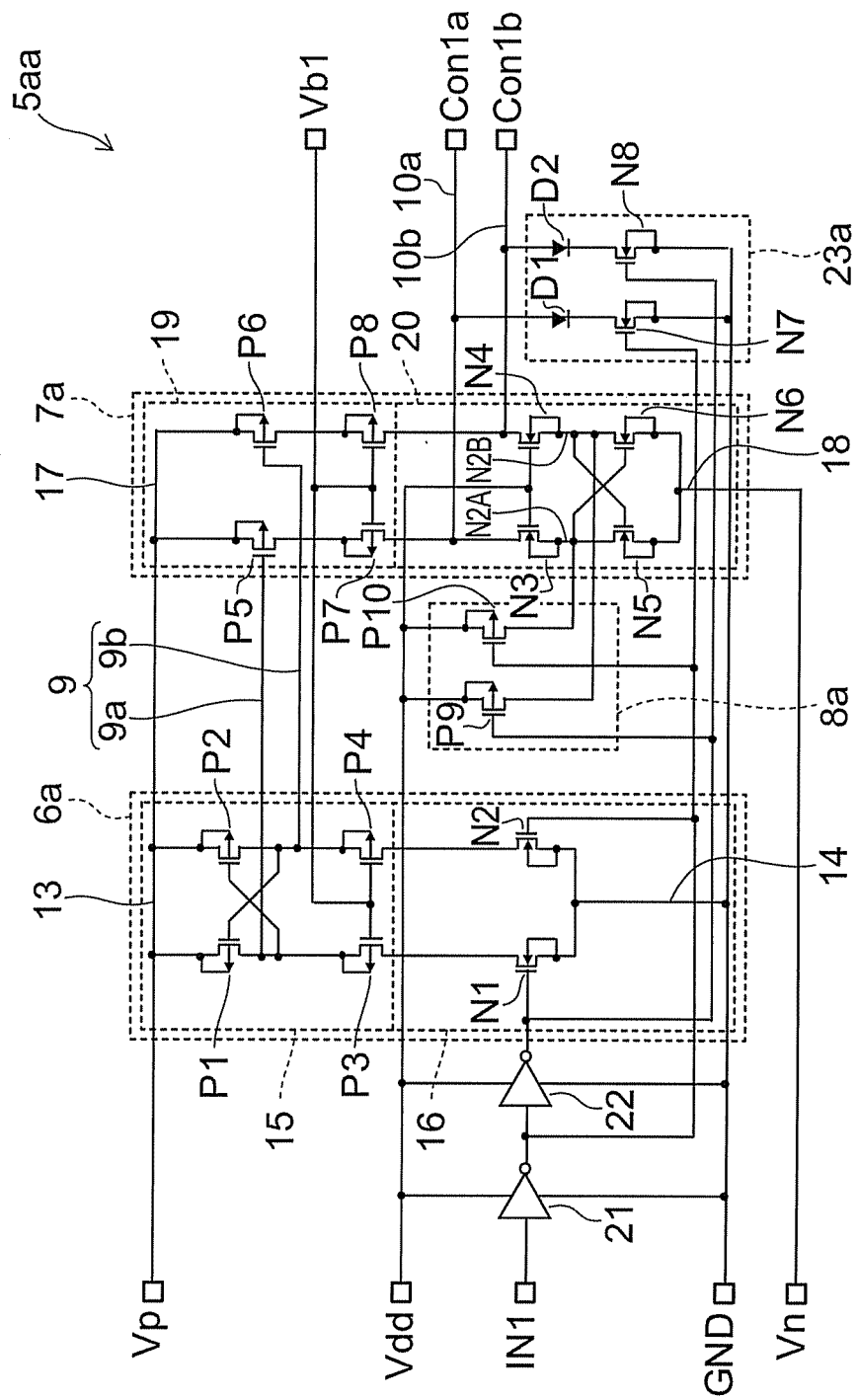
FIG. 6 is a circuit diagram illustrating a configuration of a level shifter of a semiconductor switch according to a second embodiment.

FIG. 6 is a circuit diagram illustrating a configuration of a level shifter of a semiconductor switch according to a second embodiment. Components common to those of the level shifter 5a shown in FIG. 2 are marked with like reference numerals.

As illustrated in FIG. 6, in a level shifter 5aa, a second circuit 23a is additionally provided in the level shifter 5a shown in FIG. 2.

In the second circuit 23a, a pair of diodes D1 and D2 and a pair of second transistors N7 and N8 are connected in series between a pair of second output lines 10a and 10b and a ground GND. For detailed explanation, the anode of the diode D1 is connected to the output line 10a, and the cathode is connected to the drain of the second transistor N7. The source of the second transistor N7 is connected to the ground GND. The anode of the diode D2 is connected to the output line 10b, and the cathode is connected to the drain of the second transistor N8. The source of the second transistor N8 is connected to the ground GND.

The gate of the second transistor N7 receives a one-bit terminal switching signal inputted to a switching signal terminal IN1 through an INV 21. The gate of the second transistor N8 receives the one-bit terminal switching signal inputted to the switching signal terminal IN1 through the INV 21 and an INV22. The second transistors N7 and N8 receive signals inverted to each other.

The second circuit 23a electrically connects the second output lines 10a and 10b to the ground GND according to the one-bit terminal switching signal inputted to the switching signal terminal IN1, and supplies a ground potential to the second output lines 10a and 10b (the output of the second level shifter). The second transistor N7 or N8 is switched from the OFF state to the ON state, before the potential of a control signal Con1a or Con1b is changed from a high level potential to a low level potential.

For example, the case is considered where the terminal switching signal turns from a high level potential to a low level potential, as similar to the description above. A low level potential is inputted to the gate of the second transistor N8 through the INV 21 and the INV22. The second transistor N8 is turned off, and the diode D2 connected to the second output line 10b does not affect the operation of the level shifter 5aa.

A high level potential is inputted to the gate of the second transistor N7 through the INV 21. The second transistor N7 of the second circuit 23a is turned on, and the second output line 10a is electrically connected to the ground GND, before the control signal Con1a turns from a potential of 3.5 V at high level to a potential of −1.5 V at low level. The potential of the control signal Con1a is lowered from a potential of 3.5 V at high level to the ground potential.

A second output transistor N5 and a third series transistor N3 are turned on, and then the control signal Con1a is lowered to a potential of −1.5 V at low level. When the potential of the control signal Con1a is lowered below the forward voltage of the diode D1, the diode D1 is made at a reverse bias.

Thus, the second transistor N7 in the ON state does not affect the operation of the level shifter 5aa.

As described above, the ground potential is supplied to the second output line 10a through the second circuit 23a, before the second output transistor N5 and the third series transistor N3 are turned on. Electric charges stored in the gate capacitance of each FET in a switch section 2 connected to the second output line 10a are carried to the ground GND through the diode D1 and the second transistor N7.

Thus, an amount of electric charges carried from the second output line 10a to a power supply section 4 through a second low-side switch 20 and a second low potential power supply line 18 is reduced, and the variation in a second potential Vn is suppressed.

Therefore, the level shifter 5aa is used in a driver 3, so that it is possible to further improve response characteristics in switching the terminals Also in a first level shifter 6a, first series transistors P3 and P4 are connected in series between first input transistors N1 and N2 and first output transistors P1 and P2. Thus, the response speeds of the first output transistors P1 and P2 to turn on or off are reduced according to turning on or off of the first input transistors N1 and N2.

Third Embodiment

Figure 7:
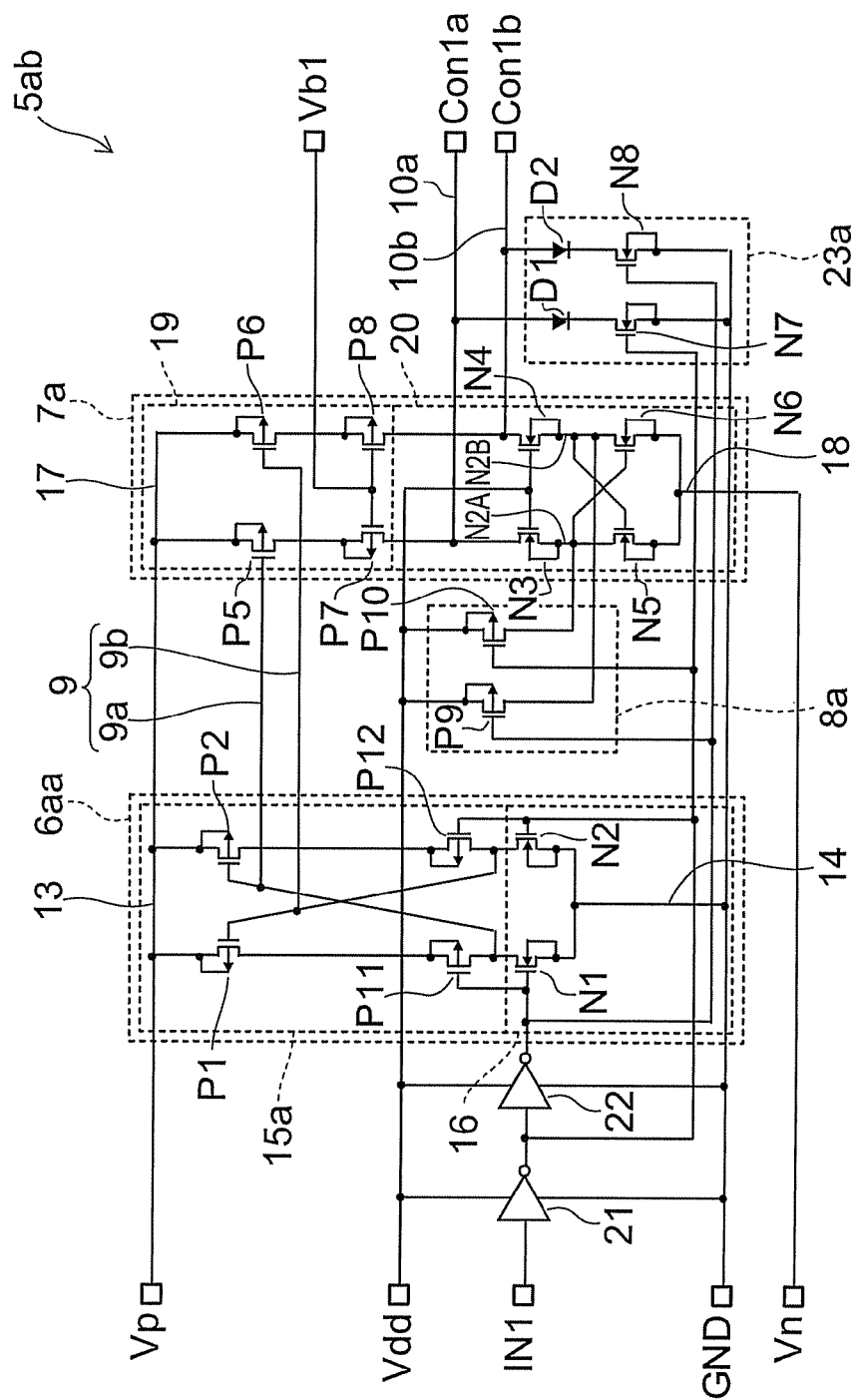
FIG. 7 is a circuit diagram illustrating a configuration of a level shifter of a semiconductor switch according to a third embodiment.

FIG. 7 is a circuit diagram illustrating a configuration of a level shifter of a semiconductor switch according to a third embodiment. Components common to those in the level shifter 5a shown in FIG. 6 are marked with like reference numerals.

As illustrated in FIG. 7, a level shifter 5ab has a configuration in which the first level shifter 6a of the level shifter 5aa shown in FIG. 6 is replaced with a first level shifter 6aa. The other components are the same as those of the level shifter 5aa shown in FIG. 6.

In the first level shifter 6aa, the high-side switch 15 of the first level shifter 6a shown in FIG. 6 is replaced with a high-side switch 15a. The other components are the same as those of the level shifter 5aa shown in FIG. 6.

A first low-side switch 16 is formed of a differential circuit of a pair of first input transistors N1 and N2 formed of an NMOS. The gate of the first input transistor N2 receives a one-bit terminal switching signal from a switching signal terminal IN1 through an INV 21. The gate of the first input transistor N1 receives the one-bit terminal switching signal from the switching signal terminal IN1 through the INV 21 and an INV22. The first input transistors N1 and N2 receive signals inverted to each other.

The first high-side switch 15a is provided with a pair of first output transistors P1 and P2 and a pair of first series transistors P11 and P12. The first output transistors P1 and P2 and the first series transistors P11 and P12 are formed of a PMOS.

The first output transistor P1 and the first series transistor P11 are connected in series between a first high potential power supply line 13 and a first output line 9a. The first output transistor P2 and the first series transistor P12 are connected in series between the first high potential power supply line 13 and a first output line 9b. The first output transistors P1 and P2 are cross-coupled to each other through the first series transistors P11 and P12. The gates of the first series transistors P11 and P12 are connected to the gates of the first input transistors N1 and N2, respectively.

For more detailed explanation, the sources of the first output transistors P1 and P2 are connected to the first high potential power supply line 13. The drain of the first output transistor P1 is connected to the source of the first series transistor P11. The drain of the first series transistor P11 is connected to the first output line 9a and the drain of the first input transistor N1.

The drain of the first output transistor P2 is connected to the source of the first series transistor P12. The drain of the first series transistor P12 is connected to the first output line 9b and the drain of the first input transistor N2. The gate of the first output transistor P1 is connected to the drain of the first series transistor P12 and the first output line 9b. The gate of the first output transistor P2 is connected to the drain of the first series transistor P11 and the first output line 9a.

The first high-side switch 15a is formed of a differential circuit of the pair of the first output transistors P1 and P2 and the pair of the first series transistors P11 and P12. Differential signals are outputted to the first output lines 9a and 9b.

In the first high-side switch 15a, the same terminal switching signals are also inputted to the gates of the first series transistors P11 and P12 as the signals inputted to the gates of the first input transistors N1 and N2.

The first series transistors P11 and P12 are turned on or off at the same time as the first input transistors N1 and N2 are turned on or off. Thus, it is possible to accelerate the response speeds of the first output transistors P1 and P2 to turn on or off. The response speeds are accelerated, so that a time period for which a current is carried through the first high-side switch 15a and the first low-side switch 16 at the same time becomes shortened. Therefore, it is possible to reduce a cross current between the first high potential power supply line 13 and the first low potential power supply line 14.

As described above, the level shifter 5ab is used in a driver 3, so that it is possible to further improve response characteristics in switching the terminals.

In the level shifter 5ab, the gates of the first series transistors P11 and P12 are connected to the gates of the first input transistors N1 and N2, respectively. Thus, a potential difference between a first potential Vp and a ground potential is applied across the gate and source of each PMOS.

However, the voltage across the drain and source of each PMOS when PMOSs are off is divided among the first output transistors P1 and P2 and the first series transistors P11 and P12. Therefore, as similar to the level shifters 5a and 5aa, a breakdown voltage across the drain and source of each PMOS can be made lower than the first potential Vp, that is, the breakdown voltage can be lowered to a voltage of 2.8 V, for example.

In the aforementioned level shifters 5a, 5aa, and 5ab, the configuration of the first level shifter is illustrated in which the first potential Vp is supplied to the first high potential power supply line 13 and the ground potential is supplied to the first low potential power supply line 14. However, it is also possible to configure the first level shifter in which the power supply potential Vdd is supplied to the first high potential power supply line 13 and the second potential Vn is supplied to the first low potential power supply line 14.

Fourth Embodiment

Figure 8:
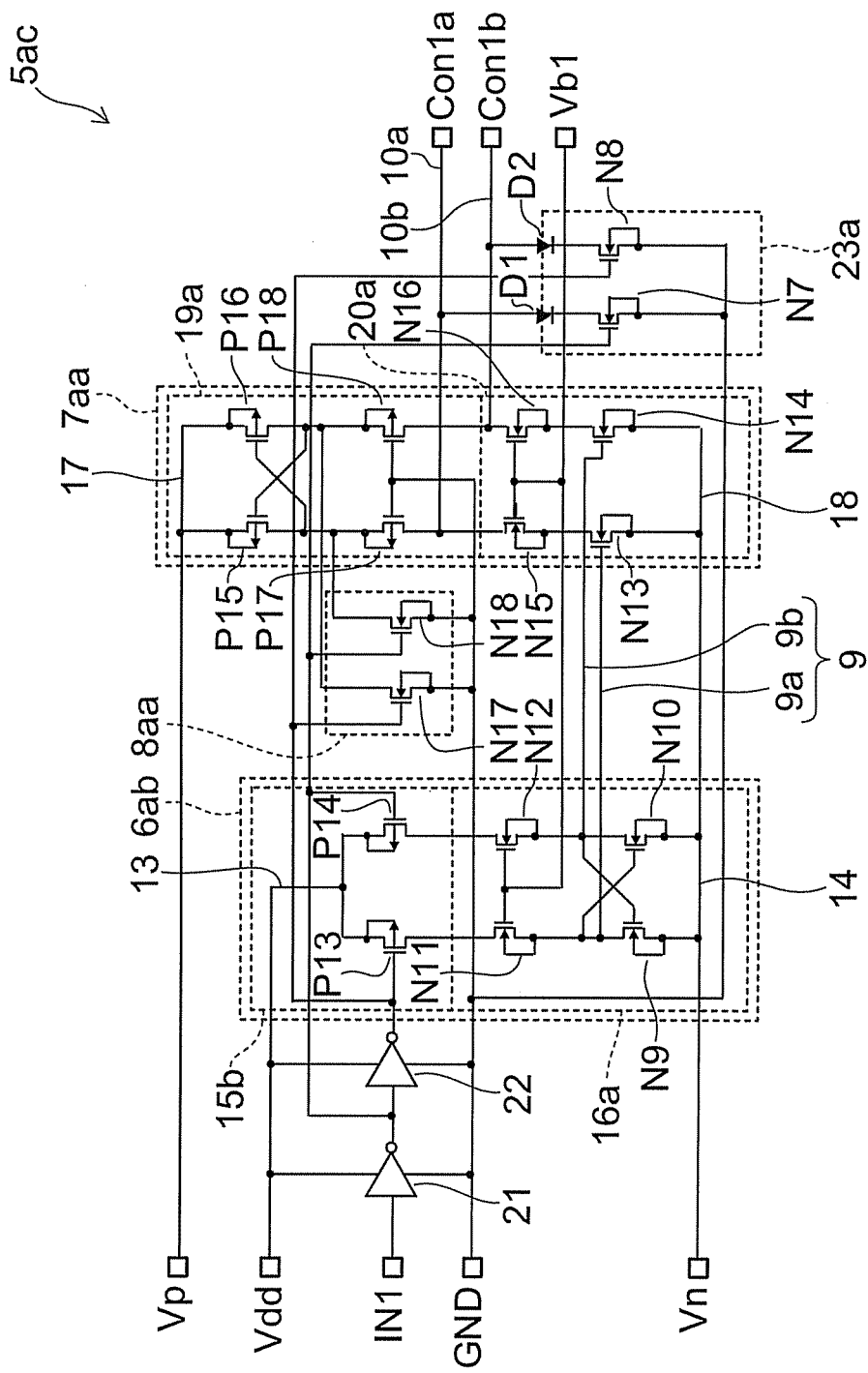
FIG. 8 is a circuit diagram illustrating a configuration of a level shifter of a semiconductor switch according to a fourth embodiment

FIG. 8 is a circuit diagram illustrating a configuration of a level shifter of a semiconductor switch according to a fourth embodiment.

As illustrated in FIG. 8, a level shifter 5ac has a first level shifter 6ab, a second level shifter 7aa, a first circuit 8aa, and a second circuit 23a.

In the first level shifter 6ab, a first high-side switch 15b and a first low-side switch 16a are connected in series between a first high potential power supply line 13 and a first low potential power supply line 14. A power supply potential Vdd is supplied to the first high potential power supply line 13. A second potential Vn is supplied to the first low potential power supply line 14.

The first high-side switch 15b is provided with a pair of first input transistors P13 and P14. The first input transistors P13 and P14 are formed of a PMOS. The sources of the first input transistors P13 and P14 are connected to the first high potential power supply line 13.

The gate of the first input transistor P14 receives a one-bit terminal switching signal from a switching signal terminal IN1 through an INV 21. The gate of the first input transistor P13 receives the one-bit terminal switching signal from the switching signal terminal IN1 through the INV 21 and an INV 22. The first input transistors P13 and P14 receive signals inverted to each other.

The power supply potential Vdd is supplied to the power supply terminals of the INV 21 and the INV 22, and the ground terminals of the INV 21 and the INV 22 are connected to a ground GND.

The first high-side switch 15b is formed of a differential circuit of the pair of the first input transistors P13 and P14.

The first low-side switch 16a is provided with a pair of first output transistors N9 and N10. The first output transistors N9 and N10 are formed of an NMOS.

The first output transistor N9 is connected between a first output line 9a and the first low potential power supply line 14.

The first output transistor N10 is connected between a first output line 9b and the first low potential power supply line 14. The first output transistors N9 and N10 are cross-coupled to each other. In FIG. 8, the first output line 9 is formed of a pair of the first output lines 9a and 9b.

For more detailed explanation, the sources of the first output transistors N9 and N10 are connected to the first low potential power supply line 14. The gate of the first output transistor N9 is connected to the drain of the first output transistor N10, and the gate of the first output transistor N10 is connected to the drain of the first output transistor N9. The drain of the first output transistor N9 is connected to the first output line 9a. The drain of the first output transistor N10 is connected to the first output line 9b.

In the first low-side switch 16a, a pair of first series transistors N11 and N12 are connected between the first high-side switch 15b and the first output lines 9a and 9b. The first series transistors N11 and N12 are formed of an NMOS. A first bias potential Vb1 is supplied to the gates of the first series transistors N11 and N12.

For more detailed explanation, the first series transistor N11 is connected between the first input transistor P13 of the first high-side switch 15b and the first output line 9a. The first series transistor N12 is connected between the first input transistor P14 of the first high-side switch 15b and the first output line 9b.

The first low-side switch 16a is formed of a differential circuit of the pair of the first output transistors N9 and N10 and the pair of the first series transistors N11 and N12. Differential signals are outputted to the first output lines 9a and 9b.

In the second level shifter 7aa, a second high-side switch 19a and a second low-side switch 20a are connected in series between a second high potential power supply line 17 and a second low potential power supply line 18. A first potential Vp is supplied to the second high potential power supply line 17. The second potential Vn is supplied to the second low potential power supply line 20.

The second low-side switch 20a is provided with a pair of second input transistors N13 and N14. The second input transistors N13 and N14 are formed of an NMOS. The sources of the second input transistors N13 and N14 are connected to the second low potential power supply line 18.

The gates of the second input transistors N13 and N14 are connected to the first output lines 9a and 9b, respectively. The second input transistors N13 and N14 receive signals inverted to each other from the first level shifter 6ab.

A pair of second series transistors N15 and N16 are connected between a pair of second output lines 10a and 10b and the pair of the second input transistors N13 and N14. The second series transistors N15 and N16 are formed of an NMOS. The first bias potential Vb1 is supplied to the gates of the second series transistors N15 and N16.

For more detailed explanation, the source of the second series transistor N15 is connected to the drain of the second input transistor N13, and the drain of the second series transistor N15 is connected to the second output line 10a. The source of the second series transistor N16 is connected to the drain of the second input transistor N14, and the drain of the second series transistor N16 is connected to the second output line 10b.

The second low-side switch 20a is formed of a differential circuit of the pair of the second input transistors N13 and N14 and the pair of the second series transistors N15 and N16. The second high-side switch 19a is provided with a pair of third series transistors P17 and P18, and a pair of second output transistors P15 and P16. The third series transistors P17 and P18 and the second output transistors P15 and P16 are formed of a PMOS.

The pair of the third series transistors P17 and P18 and the pair of the second output transistors P15 and P16 are connected in series between the second high potential power supply line 17 and the second output lines 10a and 10b. The second output transistors P15 and P16 are cross-coupled to each other.

For more detailed explanation, the, sources of the second output transistors P15 and P16 are connected to the second high potential power supply line 17. The gate of the second output transistor P15 is connected to the drain of the second output transistor P16, and the gate of the second output transistor P16 is connected to the drain of the second output transistor P15.

The third series transistor P17 is connected between the second output transistor P15 and the second output line 10a. The third series transistor P18 is connected between the second output transistor P16 and the second output line 10b. A ground potential is supplied as a second bias potential to the gates of the third series transistors P17 and P18.

The second high-side switch 19a is formed of a differential circuit of the pair of the second output transistors P15 and P16 and the pair of the third series transistors P17 and P18.

The first circuit 8aa is provided with a pair of first transistors N17 and N18. The first transistors N17 and N18 are formed of an NMOS. The first transistors N17 and N18 are connected to the second high-side switch 19a, and supply the ground potential to the second high-side switch 19a according to the one-bit terminal switching signal inputted to the switching signal terminal IN1.

For more detailed explanation, the sources of the first transistors N17 and N18 are connected to a ground GND. The drain of the first transistor N17 is connected to the drain of the second output transistor P16 of the second high-side switch 19a. The gate of the first transistor N17 receives the one-bit terminal switching signal inputted to the switching signal terminal IN1 through the INV 21 and the INV 22. The drain of the first transistor N18 is connected to the drain of the second output transistor P15 of the second high-side switch 19a. The gate of the first transistor N18 receives the one-bit terminal switching signal inputted to the switching signal terminal IN1 through the INV 21.

The first circuit 8aa supplies the ground potential to the second high-side switch 19a according to the one-bit terminal switching signal inputted to the switching signal terminal IN1. Thus, the potentials of the control signals Con1a and Con1b turn from a high level potential to a low level potential, before the potentials of the control signals Con1a and Con1b are changed according to changes in the potentials of the first output lines 9a and 9b.

Next, the operation of the level shifter 5ac will be described. In the first level shifter 6ab, terminal switching signals are inputted to the first input transistors P13 and P14 of the first high-side switch 15b. The first low-side switch 16a is turned on or off according to turning on or off of the first high-side switch 15b. Signals that the high level potential is level-shifted to approximately the first bias potential Vb1 and the low level potential is level-shifted to the second potential Vn are outputted to the first output lines 9a and 9b.

In the second level shifter 7aa, the first output lines 9a and 9b are connected to the second input transistors N13 and N14 of the second low-side switch 20a. The second high-side switch 19a is turned on or off according to turning on or off of the second low-side switch 20a. The control signals Con1a and Con1b that make the first potential Vp at high level and the second potential Vn at low level are outputted to the second output lines 10a and 10b. The operations of the first and second level shifters 6ab and 7aa are approximately the same as the operation of the level shifter 5a shown in FIG. 2.

For example, suppose that a low level potential (0 V) is inputted to the switching signal terminal IN1, the potential of the first output line 9a is maintained approximately at the first bias potential Vb1 at high level, and the potential of the first output line 9b is made at the second potential Vn (−1.5 V) at low level. The second input transistor N13 and the second series transistor N15 are turned on. The second input transistor N14 and the second series transistor N16 are turned off. Therefore, the second low-side switch 20a is turned on.

The first transistor N18 of the first circuit 8aa is tuned on to supply the ground potential to the drain of the second output transistor P15 of the second high-side switch 19a.

The drain of the second output transistor P15 is made at the ground potential, and the second output transistor P16 is turned on. The second output transistor P15 is turned off, and the third series transistor P18 is turned on. The third series transistor P17 is turned off. Therefore, the second high-side switch 19a is turned off.

The potential of the second output line 10a is made at the second potential Vn at low level, and the potential of the second output line 10b is made at the first potential Vp at high level.

Also in the level shifter 5ac, it is possible to use the first circuit 8aa to suppress an increase in the propagation delay time caused by the third series transistors P17 and P18.

The second circuit 23a is the same as the second circuit 23a of the level shifter 5aa shown in FIG. 6.

The second circuit 23a electrically connects the second output lines 10a and 10b to the ground GND according to the one-bit terminal switching signal inputted to the switching signal terminal IN1, and supplies the ground potential to the second output lines 10a and 10b (the output of the second level shifter).

An amount of electric charges carried from the second output lines 10a and 10b to the power supply section 4 through the second low-side switch 20 and the second low potential power supply line 18 is reduced, and the variation in the second potential Vn is suppressed.

Therefore, the level shifter 5ac is used in a driver 3, so that it is possible to improve response characteristics in switching the terminals as similar to the case of using the level shifter 5aa shown in FIG. 6. In FIG. 8, although the configuration provided with the second circuit 23a is illustrated, it is possible to improve response characteristics in switching the terminals also in the case where the second circuit 23a is not provided as similar to the case of using the level shifter 5a shown in FIG. 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor switch comprising:
    a power supply section configured to generate a first potential higher than a positive power supply potential, and a negative second potential;
    a driver connected to the power supply section and configured to output a control signal according to a terminal switching signal, wherein a high level potential of the control signal is set to correspond to the first potential and a low level potential of the control signal is set to correspond to the negative second potential; and
    a switch section configured to receive the control signal and switch a connection between terminals,
    the driver comprising:
        a first level shifter having a first high-side switch and a first low-side switch, wherein the first high-side switch and the first low-side switch are connected in series between the first potential and a third potential, and the first high-side switch and the first low-side switch are exclusively turned on to each other according to the terminal switching signal;
        a second level shifter having a second high-side switch and a second low-side switch, wherein the second high-side switch and the second low-side switch are connected in series between the first potential and the negative second potential, and the second high-side switch and the second low-side switch are exclusively turned on to each other according to an output potential of the first level shifter; and
        a first circuit configured to supply the positive power supply potential to the second low-side switch according to the terminal switching signal, before a potential of the control signal is changed, and turn on the second low-side switch.

2. The semiconductor switch according to claim 1, wherein the first high-side switch comprises a first series transistor connected to the first low-side switch, and the first series transistor comprises a gate supplied with a first bias potential.

3. The semiconductor switch according to claim 2, wherein the second high-side switch comprises a second series transistor connected to the second low-side switch, and the second series transistor comprises a gate supplied with a first bias potential.

4. The semiconductor switch according to claim 3, wherein the second low-side switch comprises a third series transistor connected to the second series transistor, and the third series transistor comprises a gate supplied with a second bias potential.

5. The semiconductor switch according to claim 1, wherein the driver further comprises a second circuit configured to supply the third potential to an output of the second level shifter, before the high level potential of the control signal turns to the low level potential.

6. The semiconductor switch according to claim 1, wherein:
    the terminal switching signal is inputted to the first low-side switch;
    the first potential is supplied to a first high potential power supply line;
    the third potential is supplied to a first low potential power supply line; and
    the first circuit supplies the positive power supply potential to the second low-side switch according to the terminal switching signal.

7. The semiconductor switch according to claim 6, wherein the first low-side switch comprises a first input transistor having a source connected to the first low potential power supply line and a gate to receive the terminal switching signal.

8. The semiconductor switch according to claim 6, wherein the first high-side switch comprises:
    a first output transistor comprising a source connected to the first high potential power supply line; and
    a first series transistor connected between the first output transistor and the first low-side switch, wherein the first series transistor is supplied with a first bias potential.

9. The semiconductor switch according to claim 6, wherein the first circuit comprises a first transistor having a gate to receive the terminal switching signal, a source supplied with the positive power supply potential, and a drain connected to the second low-side switch.

10. The semiconductor switch according to claim 1, wherein:
    the terminal switching signal is inputted to the first low-side switch and the first high-side switch;
    the first potential is supplied to a first high potential power supply line;
    the third potential is supplied to a first low potential power supply line; and
    the first circuit supplies the positive power supply potential to the second low-side switch according to the terminal switching signal.

11. The semiconductor switch according to claim 10, wherein the first low-side switch comprises a first input transistor having a source connected to the first low potential power supply line and a gate to receive the terminal switching signal.

12. The semiconductor switch according to claim 10, wherein the first high-side switch comprises:
    a first output transistor having a source connected to the first high potential power supply line; and
    a first series transistor connected between the first output transistor and the first low-side switch, wherein the first series transistor comprises a gate to receive the terminal switching signal.

13. The semiconductor switch according to claim 10, wherein the second high-side switch comprises:
    a second input transistor configured to receive an output potential of the first level shifter; and a second series transistor connected between the second input transistor and the second low-side switch, wherein the second series transistor comprises a gate supplied with a first bias potential.

14. The semiconductor switch according to claim 12, wherein the second low-side switch comprises:
a second output transistor having a source connected to the second low potential power supply line; and
a third series transistor connected between the second output transistor and the second high-side switch.

15. The semiconductor switch according to claim 10, wherein the first circuit comprise a first transistor having a gate to receive the terminal switching signal, a source supplied with the positive power supply potential, and a drain connected to the second low-side switch.

16. The semiconductor switch according to claim 10, wherein the driver further comprises a second circuit configured to supply the third potential to an output of the second level shifter, before the high level potential of the control signal turns to the low level potential.

17. The semiconductor switch according to claim 1, wherein:
the terminal switching signal is inputted to the first high-side switch;
the positive power supply potential is supplied to a first high potential power supply line;
the negative second potential is supplied to a first low potential power supply line; and
the first circuit supplies the third potential to the second high-side switch according to the terminal switching signal.

18. The semiconductor switch according to claim 17, wherein the first high-side switch comprises a first input transistor having a source connected to the first high potential power supply line and a gate to receive the terminal switching signal.

19. The semiconductor switch according to claim 17, wherein the first low-side switch comprises:
a first output transistor having a source connected to the first low potential power supply line; and
a first series transistor connected between the first output transistor and the first high-side switch, wherein the first series transistor is supplied with a first bias potential.

20. The semiconductor switch according to claim 17, wherein the first circuit comprises a first transistor having a gate to receive the terminal switching signal, a source connected to a ground, and a drain connected to the second high-side switch.

* * * * *